United States Patent
Itani

(10) Patent No.: US 6,905,983 B2
(45) Date of Patent: Jun. 14, 2005

(54) APPARATUS AND METHOD FOR MANUFACTURING SEMICONDUCTOR DEVICES, AND SEMICONDUCTOR DEVICE

(75) Inventor: Takaharu Itani, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 64 days.

(21) Appl. No.: 10/395,230

(22) Filed: Mar. 25, 2003

(65) Prior Publication Data

US 2004/0108519 A1 Jun. 10, 2004

(30) Foreign Application Priority Data

Dec. 4, 2002 (JP) ........................................ 2002-352745

(51) Int. Cl.$^7$ .............................................. H01L 21/26
(52) U.S. Cl. ........................... 438/795; 438/22; 438/28; 438/46; 438/796; 438/799; 257/80; 257/81; 257/82; 257/103
(58) Field of Search ................................. 438/795–800

(56) References Cited

U.S. PATENT DOCUMENTS 6,586,874 B1 * 7/2003 Komoto et al. ............. 313/503

FOREIGN PATENT DOCUMENTS

| JP | 361131426 | * | 6/1986 |
| JP | 403006018 | * | 1/1991 |
| JP | 3-276625 | | 12/1991 |
| JP | 2515883 | | 4/1996 |
| JP | 2001-319887 | * | 11/2001 |
| JP | 2004-31867 | | 1/2004 |

OTHER PUBLICATIONS

Copy of Notification of Reasons for Rejection Issued Mar. 15, 2005 by the Japan Patent Office in counterpart application JP 2002–352745, and English–language translation thereof.

* cited by examiner

*Primary Examiner*—Andy Huynh
(74) *Attorney, Agent, or Firm*—Finnegan, Henderson, Farabow, Garrett & Dunner, L.L.P.

(57) ABSTRACT

An apparatus of manufacturing a semiconductor device is disclosed which comprises at least one heat/light source opposing at least one major surface of a to-be-processed substrate, the heat/light source emitting light rays with a heating function onto the major surface of the to-be-processed substrate, and at least one light intensity adjusting member interposed between the heat/light source and the to-be-processed substrate, the light intensity adjusting member being made of a material which can pass therethrough the light rays, the light intensity adjusting member adjusting, to a substantially predetermined value, an intensity of the light rays at the major surface of the to-be-processed substrate.

28 Claims, 10 Drawing Sheets

APPARATUS AND METHOD FOR MANUFACTURING SEMICONDUCTOR DEVICES, AND SEMICONDUCTOR DEVICE

CROSS-REFERENCE TO RELATED APPLICATIONS

This application is based upon and claims the benefit of priority from the prior Japanese Patent Application No. 2002-352745, filed Dec. 4, 2002, the entire contents of which are incorporated by reference.

BACKGROUND OF THE INVENTION

1. Field of the Invention

The present invention relates to a heat treatment technique employed in a process for manufacturing semiconductor devices, and more particularly to an apparatus and method for manufacturing semiconductor devices, which are planned to reduce the degree of non-uniformity of heating when an impurity diffusion region, for example, is formed, and also relates to a semiconductor device manufactured by the apparatus and method.

2. Description of the Related Art

To appropriately form functional regions, such as source/drain regions, channel regions, etc., it is necessary to appropriately heat (anneal) semiconductor substrates (wafers) when or after ions are injected into them. For example, wafers are heated to approx. 1000° C. for approx. thirty minutes. However, heating at such a high temperature for such a long period causes diffusion of an impurity while the impurity is being activated. This makes it difficult to appropriately form the source/drain regions, channel regions, etc.

To activate an impurity while suppressing the diffusion of the impurity, so-called rapid thermal anneal (RTA), which requires only a short heat treatment period, has been introduced. In RTA, a tungsten filament halogen lamp, for example, is used as a heating device, and wafers are heated to approx. 1000° C. for approx. ten seconds. Japanese Patent No. 2515883, for example, discloses this technique. However, even RTA has come to cause diffusion of impurities as microfabrication of semiconductor devices has been developed. Thus, it has become difficult to acquire a desired impurity profile.

In light of the above, annealing that uses a flash lamp has been highlighted as one for enhancing the rate of activation of an impurity in a shorter period. This flash lamp contains, for example, a gas such as xenon. This technique is disclosed in, for example, Japanese Patent Application KOKAI No. 2001-319887. The conditions of annealing using the flash lamp are, for example, a current-carrying period of approx. 10 ms or less, and an emission energy density of approx. 100 J/cm² or less.

However, if the heating period is shortened in a heating method using a lamp, it becomes difficult to maintain the in-plane uniformity of the heated state as the surface area of an object to be processed such as a wafer increases. For example, assume that after light from a flash lamp is emitted onto a wafer into which ions are injected, the sheet resistance of an impurity diffusion layer formed by the light irradiation is measured. There is a tendency in which the sheet resistance is lowest just below the lamp, and increases away from the lamp. In other words, it is possible that variations in the in-plane sheet resistance of the wafer may fall outside an allowable range. This is because of the following reason. Just below the lamp, the light emitted from the lamp enters the surface of the wafer at substantially 0°. On the other hand, as the distance from the lamp increases, the angle of incidence of the light entering the surface of the wafer increases. Accordingly, the energy density of the light is lower in the area away from the lamp than in the area just below the lamp. As a result, the light intensity (heat amount) varies over the wafer surface, thereby causing uneven heating. This may cause variations of electric characteristics in the surface of the wafer obtained after heating, and hence degrade the quality of the wafer.

There is a technique for, for example, rotating a wafer during light irradiation (heating) in order to suppress variations of light intensity at the wafer surface. In general, however, since the rotational speed of a wafer is relatively high compared with the period of light irradiation, it is difficult to substantially uniformly irradiate the surface of the wafer with light while the wafer is rotated through 360 degrees. Therefore, this method cannot be applied to the aforementioned RTA or annealing using a flash lamp, in which the light irradiation period is extremely short.

Furthermore, there is a technique for, for example, arranging an opaque quartz plate between a lamp and wafer. In this technique, the opaque quartz plate, which is directly heated by the lamp, substantially uniformly heats the surface of the wafer (i.e., the wafer is indirectly heated by the lamp). In general, however, it takes a relatively long time for the opaque quartz plate to radiate sufficient heat. Accordingly, this method is also inapplicable to, for example, RTA in which the light irradiation period is extremely short.

In addition, there is a technique for interposing between a lamp and wafer a transparent quartz plate that is provided with light shielding members (filters) at selected portions. In this method, the plate has light shielding and passing portions appropriately arranged to suppress variations in light intensity at the surface of a wafer. However, in this technique, the maximum value of the light intensity is reduced by the existence of the light shielding portions, and hence the efficiency of heating degrades. This may lead to an increase in the time required for heating the wafer. Therefore, this method is also inapplicable to, for example, RTA in which the light irradiation period is extremely short.

BRIEF SUMMARY OF THE INVENTION

According to an aspect of the invention, there is provided an apparatus of manufacturing a semiconductor device, comprising: at least one heat/light source opposing at least one major surface of a to-be-processed substrate, the heat/light source emitting light rays with a heating function onto the major surface of the to-be-processed substrate; and at least light intensity adjusting member interposed between the heat/light source and the to-be-processed substrate, the light intensity adjusting member being made of a material which can pass therethrough the light rays, the light intensity adjusting member adjusting, to a substantially predetermined value, an intensity of the light rays at the major surface of the to-be-processed substrate.

According to another aspect of the invention, there is provided a method of manufacturing a semiconductor device, comprising: interposing at least one light intensity adjusting member between a to-be-processed substrate and a heat/light source opposing at least one major surface of the to-be-processed substrate, and emitting light rays from the heat/light source onto the at least one major surface of the to-be-processed substrate; and adjusting, to a substantially predetermined value, an intensity of the light rays at the major surface of the to-be-processed substrate, using the light intensity adjusting member, the light intensity adjusting member being formed of a material which can pass therethrough the light rays.

According to a further aspect of the invention, there is provided a semiconductor device comprising: a semiconductor substrate on which a heating process is executed by a semiconductor device manufacturing apparatus, the semiconductor device manufacturing apparatus including: at least one heat/light source opposing at least one major surface of a to-be-processed substrate, the heat/light source emitting light rays with a heating function onto the major surface of the to-be-processed substrate; and at least light intensity adjusting member interposed between the heat/light source and the to-be-processed substrate, the light intensity adjusting member being made of a material which can pass therethrough the light rays, the light intensity adjusting member adjusting, to a substantially predetermined value, an intensity of the light rays at the major surface of the to-be-processed substrate.

According to yet another aspect of the invention, there is provided a semiconductor device comprising: a semiconductor substrate on which a heating process is executed by a semiconductor device manufacturing method, the semiconductor device manufacturing method including: interposing at least one light intensity adjusting member between a to-be-processed substrate and a heat/light source opposing at least one major surface of the to-be-processed substrate, and emitting light rays from the heat/light source onto the at least one major surface of the to-be-processed substrate; and adjusting, to a substantially predetermined value, an intensity of the light rays at the major surface of the to-be-processed substrate, using the light intensity adjusting member, the light intensity adjusting member being formed of a material which can pass therethrough the light rays.

DETAILED DESCRIPTION OF THE INVENTION

Embodiments of the invention will be described in detail with reference to the accompanying drawings.

(First Embodiment)

Figure 1:
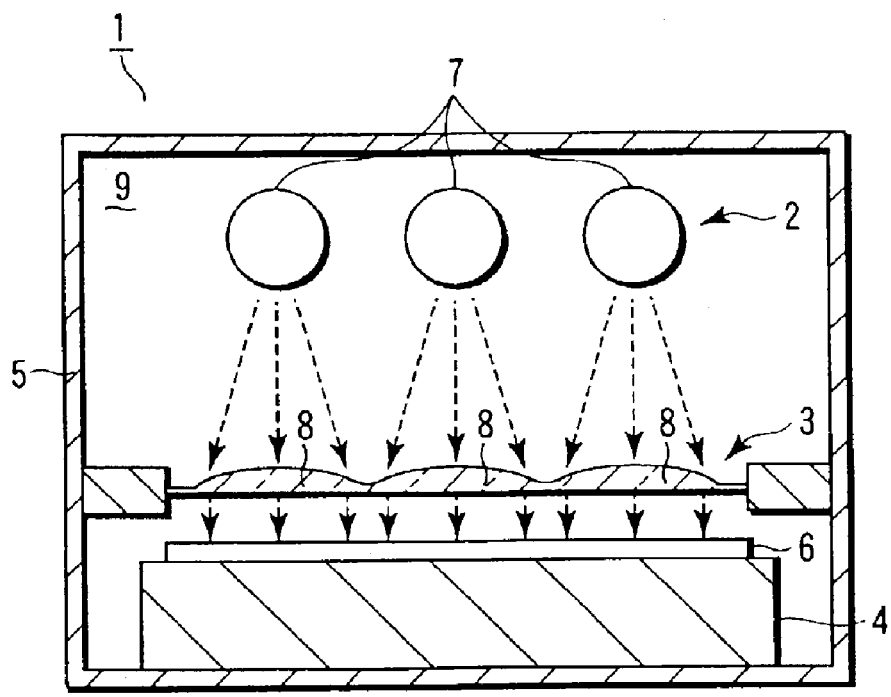
FIG. 1 is a sectional view illustrating a semiconductor device manufacturing apparatus according to a first embodiment of the invention.
Figure 2:
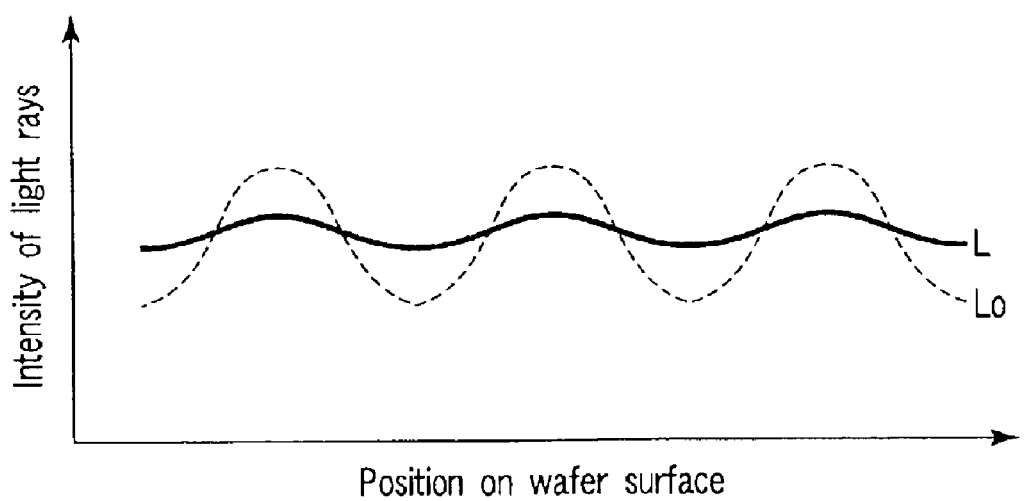
FIG. 2 is a graph illustrating the light intensity distributions of the surfaces of semiconductor substrates obtained by the manufacturing apparatus of the first embodiment and a conventional manufacturing apparatus.
Figure 3:
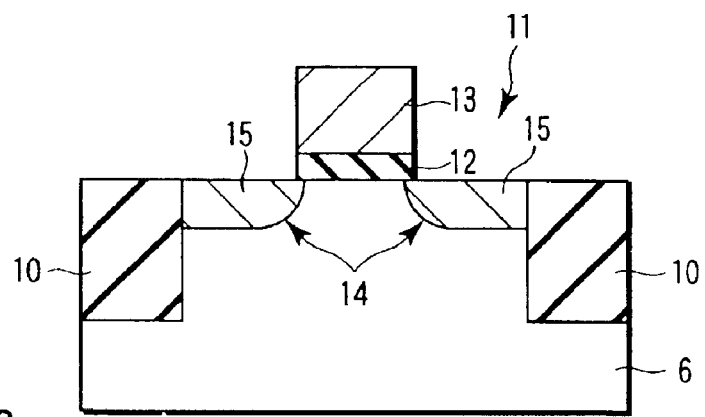
FIG. 3 is a sectional view illustrating a process step for manufacturing a semiconductor device according to the first embodiment.
Figure 4:
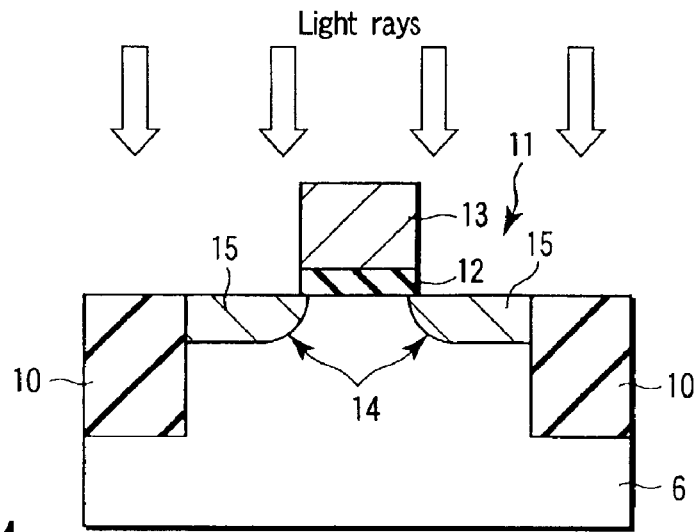
FIG. 4 is a sectional view illustrating another process step for manufacturing the semiconductor device according to the first embodiment.
Figure 5:
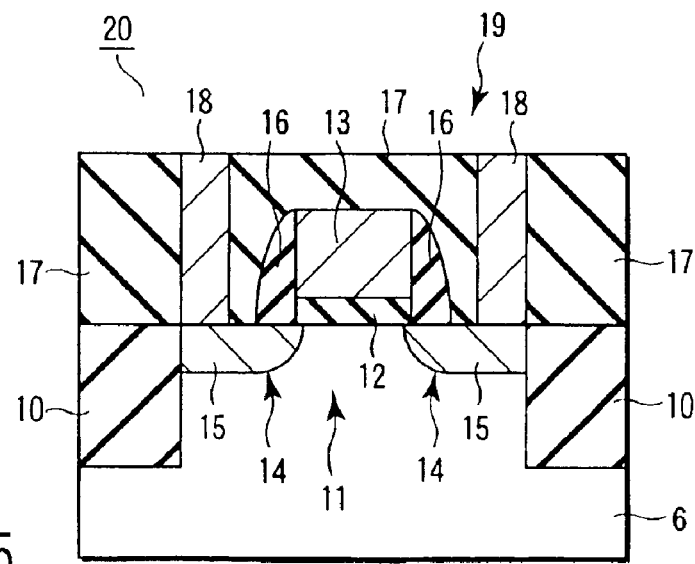
FIG. 5 is a sectional view illustrating yet another process step for manufacturing the semiconductor device according to the first embodiment.

Referring now to FIGS. 1–5, a first embodiment of the invention will be described. FIG. 1 is a sectional view illustrating a semiconductor device manufacturing apparatus according to the first embodiment. FIG. 2 is a graph illustrating the light intensity distributions of the surfaces of semi-conductor substrates obtained by the manufacturing apparatus of the first embodiment and a conventional manufacturing apparatus. FIGS. 3–5 are sectional views illustrating process steps for manufacturing the semiconductor device of the first embodiment.

Referring first to FIGS. 1 and 2, the semiconductor device manufacturing apparatus of the first embodiment will be described.

As seen from FIG. 1, a semiconductor device manufacturing apparatus 1 comprises a heat/light source 2, light intensity adjusting member 3, substrate susceptor 4 and housing 5, etc. In short, the apparatus 1 is a so-called heat treatment apparatus.

The heat/light source 2 opposes one major surface of a to-be-processed substrate 6. As indicated by the broken line in FIG. 1, the heat/light source 2 emits light rays (heat waves) having a heating function onto the to-be-processed substrate 6 to heat it. Specifically, the heat/light source 2 is a flash lamp light-source unit formed of three flash lamps 7. As the flash lamp 7, a xenon lamp for emitting light rays with a wavelength of approx. 1 μm or less is used.

As shown in FIG. 1, the light intensity adjusting member 3 is interposed between the flash lamp light-source unit 2 and to-be-processed substrate 6. The light intensity adjusting member 3 adjusts, to substantially the same value, the intensity of the light rays at the major surface of the substrate 6. This will be described in detail.

The light intensity adjusting member 3 is formed of a material that passes therethrough light rays emitted from each flash lamp 7. More specifically, the material has a high transmittance and hence permits light rays to pass therethrough with little thermal energy loss. This material is, for example, quartz. Further, the light intensity adjusting member 3 has a size that enables light rays to be uniformly irradiated onto the entire major surface of the to-be-processed substrate 6.

The light intensity adjusting member 3 has incident angle adjusting portions 8. The incident angle adjusting portion 8 deflects the light rays emitted from each flash lamp 7, thereby adjusting, to substantially the same value, the incident angle of the light rays with respect to the major surface of the substrate 6. In this embodiment, as shown in FIG. 1, the incident angle adjusting portions 8 project from the several portions of the major surface of the light intensity adjusting member 3 that oppose the light source unit 2. Furthermore, the incident angle adjusting portions 8 has convex lens portions with respective curved surfaces.

The light rays emitted from each flash lamp 7 in various directions have their advancing directions adjusted by the incident angle adjusting portions 8. Specifically, the light rays having passed through the incident angle adjusting portions 8 have their advancing directions adjusted to enter the to-be-processed substrate 6 in substantially parallel. The energy density of the light rays at the surface of the substrate 6 increases as the incident angle of the light rays to the surface of the substrate 6 decreases. Accordingly, it is preferable that the incident angle of the light rays to the surface of the substrate 6 is approx. 0° all over the substrate surface.

In the embodiment, as indicated by the broken line in FIG. 1, each convex lens portion 8 is designed so that the incident angle of the light rays to the surface of the substrate 6 will be adjusted to approx. 0° all over the substrate surface. Actually, however, the incident angle of the light rays to the surface of the substrate 6 is adjusted to approx. 0°±3° all over the substrate surface. If the incident angle of the light rays to the surface of the substrate 6 is within 0°±3°, the intensity of the light rays is substantially equal to that obtained when the incident angle is 0°. Therefore, when the substrate 6 is heated, variations in the intensity of the light rays due to variations in the incident angle of the light rays within approx. ±3° fall within a sufficiently allowable range. In other words, variations in the incident angle of the light rays within approx. ±3° fall can be ignored.

Further, each convex lens portion 8 is designed to adjust the energy density of the light rays to substantially the same value all over the entire surface of the substrate 6. Accordingly, the light rays emitted from the flash lamps 7 are applied to the entire surface of the substrate 6 at substantially the same intensity and thermal energy density. This will be described in detail.

If no light intensity adjusting member 3 is provided between the light source unit 2 and substrate 6 as in the prior art, the light rays emitted from the flash lamps 7 has the intensity characteristic indicated by the broken line $L_0$ in FIG. 2. The closer to each flash lamp 7, the higher the intensity of the light rays, and the intensity of the light rays is highest (locally maximum) just below each flash lamp 7. The intensity of the light rays just below each flash lamp 7 corresponds to a corresponding peak of the broken line $L_0$. Further, the remoter from each flash lamp 7, the lower the intensity of the light rays, and the intensity of the light rays is lowest (locally minimum) at an intermediate position between the adjacent flash lamps 7. The intensity of the light rays at the intermediate position corresponds to a corresponding trough of the broken line $L_0$. Thus, if there is no light intensity adjusting member, the intensity (thermal energy) of the light rays greatly varies at the surface of the to-be-processed substrate 6.

Therefore, if the substrate 6 is heated without the light intensity adjusting member 3, variations in the degree of heating will fall outside an allowable range. This makes it difficult to maintain the in-plane uniformity of the heated state of the substrate surface. As a result, variations in the electric characteristics outside an allowable range may easily occur in the surface of the heated substrate 6, thereby degrading the quality of the resultant substrate 6 and reducing the yield of products. The aforementioned variations in the degree of heating become conspicuous as the irradiation time of light rays, i.e., the heating time of the to-be-processed substrate 6, is reduced. Further, the variations in the degree of is heating become larger as the increase of efficiency of manufacturing semiconductor devices is attempted. Thus, contrary to the attempt to increase the manufacturing efficiency, it may decrease.

On the other hand, if the light intensity adjusting member 3 is interposed between the light source unit 2 and to-be-processed wafer 6 as in the embodiment, the light rays emitted from the flash lamps 7 have the intensity characteristic, indicated by the solid line L in FIG. 2, at the surface of the substrate 6. As is evident from the comparison of the solid line L with the broken line $L_0$, the light intensity adjusting member 3 significantly reduces the range of variations in the intensity of light rays at the surface of the substrate 6. In other words, the intensity of the light rays at the surface of the substrate 6 is made substantially uniform by the light intensity adjusting member 3. At the same time, the average intensity of the light rays obtained at the entire surface of the substrate 6 using the light intensity adjusting member 3 is higher than that obtained without the light intensity adjusting member 3. This is partly because the light rays emitted from the light source unit 2 are appropriately converged and diverged by the convex lens portions 8 of the light intensity adjusting member 3, and then irradiated onto the substrate 6 in the form of parallel light rays of a substantially uniform energy density. It is also because the light intensity adjusting member 3 is made of a material of a high transmittance that permits light rays to pass therethrough with little thermal energy loss.

As seen from FIG. 1, the substrate susceptor 4 for supporting the to-be-processed substrate 6 oppose the light source unit 2 with the light intensity adjusting member 3 interposed therebetween. In the embodiment, the substrate 6 is placed on the substrate susceptor 4. The substrate susceptor 4 is also called "wafer stage".

The housing 5 contains the aforementioned light source unit 2, light intensity adjusting member 3, wafer stage 4 and substrate 5, etc., as is shown in FIG. 1. The internal space of the housing 5 forms a process chamber 9 for heating the to-be-processed substrate 6. The housing 5 is also called "lamp house".

As described above, the semiconductor device manufacturing apparatus 1 is a so-called lamp heating apparatus. More specifically, the manufacturing apparatus 1 is a lamp heating apparatus called a rapid thermal anneal (RTA) apparatus or rapid thermal process (RTP) apparatus. In the lamp heating apparatus 1, the light rays emitted from the light source unit 2 in various directions can be applied, as parallel light of a substantially uniform intensity or energy density, to the entire surface of the substrate 6 at an incident angle of substantially 0°, using the light intensity adjusting member 3. In other words, in the lamp heating apparatus 1, the light intensity adjusting member 3 can suppress excessive convergence of light rays on a particular portion of the substrate surface, and/or excessive divergence of the light rays from a particular portion.

Further, in the lamp heating apparatus 1, a so-called optical filter, such as a blackout curtain, is not used for making the intensity of light rays uniform at the surface of the to-be-processed substrate 6. Further, the light intensity adjusting member 3 is formed of a material having a high transmittance that does not substantially reduce the thermal energy of light rays, as is aforementioned. As a result, in the lamp heating apparatus 1, the loss of thermal energy of the light rays at the surface of the substrate 6 with respect to those just emitted from the light source unit 2 is suppressed. Accordingly, the lamp heating apparatus 1 of the embodiment can efficiently and uniformly heat the substrate 6 in a short time regardless of the surface area of the substrate 6, using light rays. This enhances the quality of the resultant substrate 6, resulting in the increase of the yield and production efficiency of semiconductor devices with the resultant substrates 6. Further, the cost of manufacturing semiconductor devices with the resultant substrates 6 can be inevitably reduced.

Referring to FIGS. 3–5, a description will be given of a method and semiconductor device according to the embodiment. Specifically, this method relates to a RTA (RTP) process, in which an impurity diffusion region is annealed by the above-described lamp heating apparatus 1. Further, the semiconductor device is provided with a semiconductor substrate that has an impurity diffusion region annealed by the lamp heating apparatus 1 in the RTA process.

Firstly, as seen from FIG. 3, an element isolating region 10 having an STI structure is formed in the surface of a to-be-processed semiconductor substrate (wafer) 6 by, for example, a general MOS transistor manufacturing method. The wafer 6 is made of, for example, monocrystalline silicon. Subsequently, a gate electrode 13 is formed, by photolithography or dry etching, etc., on an element region 11 defined by the element isolating region 10, with a gate insulating film 12 interposed therebetween. The gate electrode 13 is made of, for example, polysilicon. After that, using the gate electrode 13 as a mask, an ion implanted layer 15 is formed in an impurity diffusion region 14 in the element region 11. The impurity diffusion region 14 serves as a source/drain region 14 in a later stage. An impurity implanted into the impurity diffusion region 14 is, for example, an n-type impurity such as phosphor (P) or arsenic (As), or a p-type impurity such as boron (B).

Thereafter, as seen from FIG. 4, the wafer 6 is housed into a process chamber 9 defined in the lamp heating apparatus 1 of the embodiment using a xenon lamp 7 as a flash lamp, whereby it is heated for activating the impurity (anneal process). Before the anneal process, the wafer 6 is placed on a pre-heating plate (not shown), and preheated to approx. 500° C. Subsequently, as indicated by the outline arrows of FIG. 4, each flash lamp 7 emits light rays onto the wafer 6 for a predetermined extremely short time. At this time, the energy density of the light rays is set to approx. 30 J/cm². Under this condition, RTA is executed on the wafer 6. As aforementioned, the light intensity adjusting member 3 is interposed between the wafer 6 and flash lamp light-source unit 2 (flash lamps 7). As a result, the impurity is slightly diffused to form a diffusion layer, and is electrically activated. Thus, a desired impurity diffusion region (source/drain region) 14 is formed in the surface of the wafer 6.

After that, as seen from FIG. 5, a side wall insulating film 16, interlayer insulating film 17, contact electrode 18, etc. are formed by a general MOS transistor manufacturing method. As a result, a MOS transistor 19 is formed on the wafer 6. Thus, a plurality of such fine MOS transistors 19 (not shown) are provided on the wafer 6, thereby forming a desired semiconductor device 20. In short, RTA is executed by the lamp heating apparatus 1 of the embodiment, providing a semiconductor device 20 with a plurality of MOS transistor having source/drain regions 14.

As described above, in the semiconductor manufacturing method of the embodiment, RTA is executed using the lamp heating apparatus 1, which suppresses uneven heating of the wafer 6. Accordingly, the surface of the wafer 6 can be heated more uniformly than in the prior art. As a result, the impurity can be activated more uniformly, and a more uniform diffusion length of the impurity can be realized. This leads to reduction of the range of variations in electrical performance between the MOS transistors 19. For example, the range of variations in the ON-current flowing through each MOS transistor 19 can be minimized.

In the conventional semiconductor device manufacturing methods (RTA, RTP), the electric characteristics of the MOS transistors in one wafer greatly differ, accordingly, semiconductor devices with integrated MOS transistors show significant variations in performance. For example, the semiconductor devices show significant variations in operation speed, which means that they are unstable in operation speed. Furthermore, in general, the performance of the semiconductor device is determined from that of the most degraded one of the MOS transistors integrated in the semiconductor device. For example, the operation speed of the semiconductor device is limited by the MOS transistor of the lowest operation speed. Therefore, if the MOS transistors vary in performance, the performance of the entire semiconductor device degrades.

On the other hand, in the semiconductor device 20 of the embodiment, in which RTA is performed using the lamp heating apparatus 1, the source/drain regions 14 of the MOS transistors 19 are formed in a substantially uniform, good condition. In other words, in the semiconductor device 20, variations in performance between the MOS transistors 19 are sufficiently suppressed. Accordingly, the semiconductor device 20 with such MOS transistors 19 is stable of its performance and shows a high performance. In short, the semiconductor device 20 is of high performance, quality and reliability.

As described above, in the first embodiment, when the substrate 6 is heated, the light intensity adjusting member 3 is used which has the convex lens portions 8 interposed between the wafer 6 and heat/light source 2. The light rays emitted from the heat/light source 2 are made to enter the convex lens portions 8. The convex lens portions 8 deflect the light rays to converge or diverge them so as to achieve an appropriate state of light rays. Specifically, the light rays emitted from the light source unit 2 in various directions are adjusted into parallel light of a substantially uniform intensity and energy density, and are then applied to the surface of the to-be-processed substrate 6 at an incident angle of substantially 0°. As a result, the light rays are prevented from being converged or diverged on a portion of the surface of the substrate 6. In other words, at the surface of the substrate 6, the difference in light intensity between the position remote from the heat/light source 2 and the position close to the source 2 can be minimized.

Further, the light rays at the surface of the substrate 6 can be made to a substantially uniform intensity by setting the curvature of each convex lens portion 8, the distance between the heat/light source 2 and light intensity adjusting member 3, etc. to respective appropriate values. Thus, the surface of the substrate 6 can be substantially uniformly irradiated with light rays in an appropriate state. In other words, the problem can be solved in which the light rays have different intensities at the surface of the substrate 6, thereby heating different portions of the surface at different temperatures.

Furthermore, in the embodiment, there is little energy loss in the light rays emitted from the heat/light source 2. As a result, the substrate 6 can be efficiently and substantially uniformly heated. For example, the heating process can be performed, while the thermal stress that may occur in the substrate 6 is suppressed to suppress the occurrence of, for example, crystal defects.

Accordingly, in the first embodiment, the substrate 6 can be heated efficiently and substantially uniformly in a short time, using light rays, regardless of the surface area of the substrate 6. As a result, a semiconductor device with a semiconductor substrate 6 of good quality realized by reduction of the influence of uneven heating can be manufactured. This enhances the yield and production efficiency of semiconductor devices with such substrates 6, which is improved its quality.

(Second Embodiment)

Figure 6:
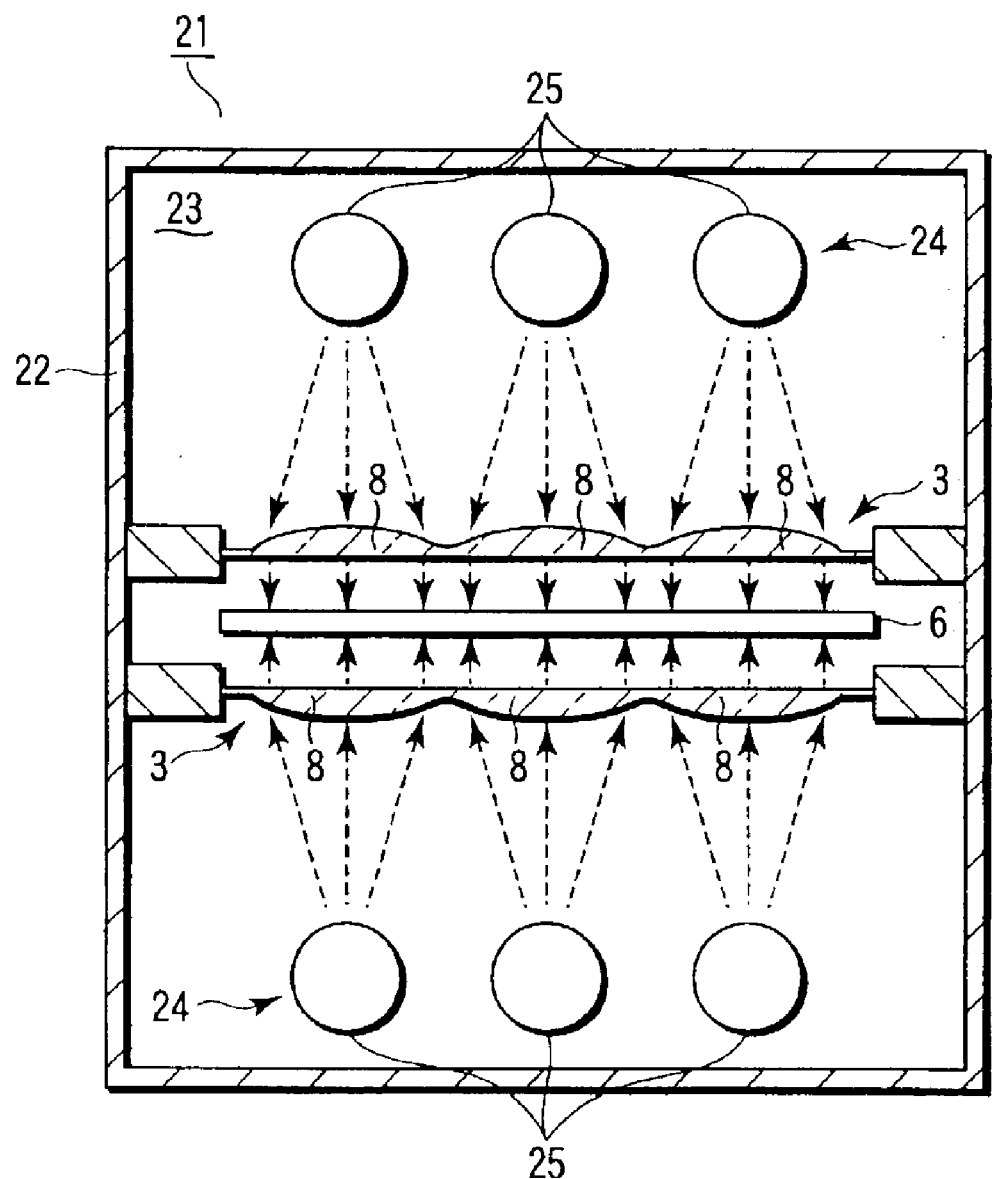
FIG. 6 is a sectional view illustrating a semiconductor device manufacturing apparatus according to a second embodiment.

Referring then to FIG. 6, a second embodiment of the invention will be described. FIG. 6 is a sectional view illustrating a semiconductor device manufacturing apparatus 21 according to the second embodiment. In FIG. 6, elements similar to those employed in the first embodiment are denoted by corresponding reference numerals, and no detailed description is given thereof.

As shown in FIG. 6, in the semiconductor device manufacturing apparatus 21, a to-be-processed substrate 6 is supported by a substrate susceptor (not shown) at a central position in a process chamber 23 defined by a lamp house 22. Respective light intensity adjusting members 3 are provided, opposing the upper and lower surfaces of the substrate 6. Three lamps 25 oppose each of the upper and lower surfaces of the substrate 6, with a corresponding light intensity adjusting member 3 interposed therebetween. In other words, a pair of light source units 24 oppose the upper and lower surfaces of the substrate 6, with the respective light intensity adjusting members 3 interposed therebetween. Each light intensity adjusting member 3 has a plurality of convex lens portions 8 opposing a corresponding light source unit 24. Thus, the semiconductor device manufacturing apparatus of this embodiment is also a lamp heating apparatus (21).

As stated above, the second embodiment can provide the same advantage as obtained by the first embodiment. Further, since the lamp heating apparatus 21 can simultaneously heat the upper and lower surfaces of the substrate 6, the heating efficiency becomes double, thereby doubling the semiconductor device manufacturing efficiency.

(Third Embodiment)

Figure 7:
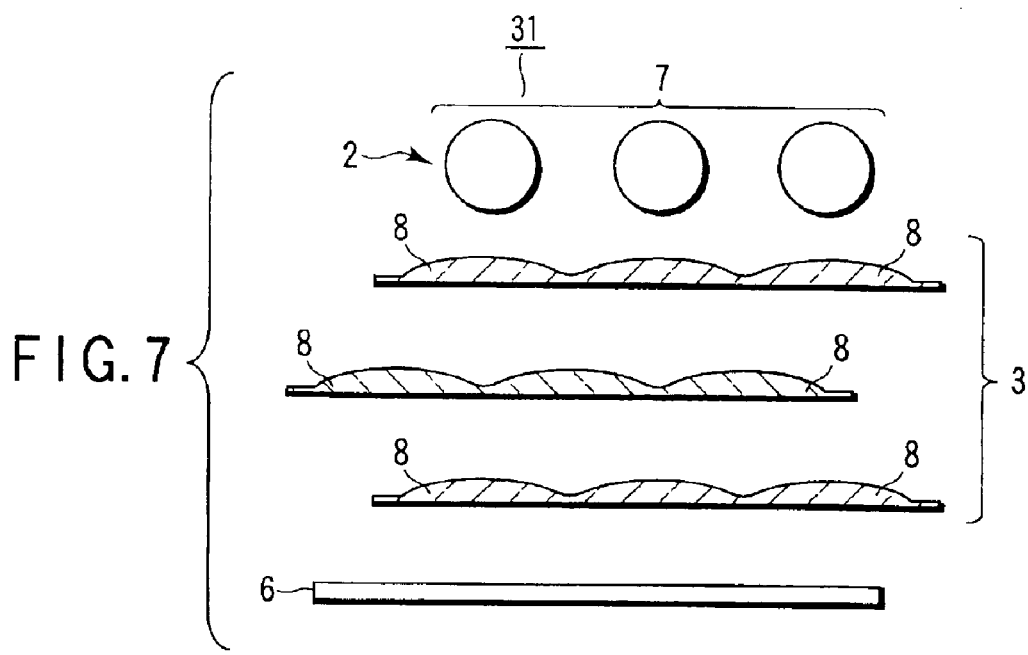
FIG. 7 is a sectional view illustrating the interior of a process chamber incorporated in a semiconductor device manufacturing apparatus according to a third embodiment.
Figure 8:
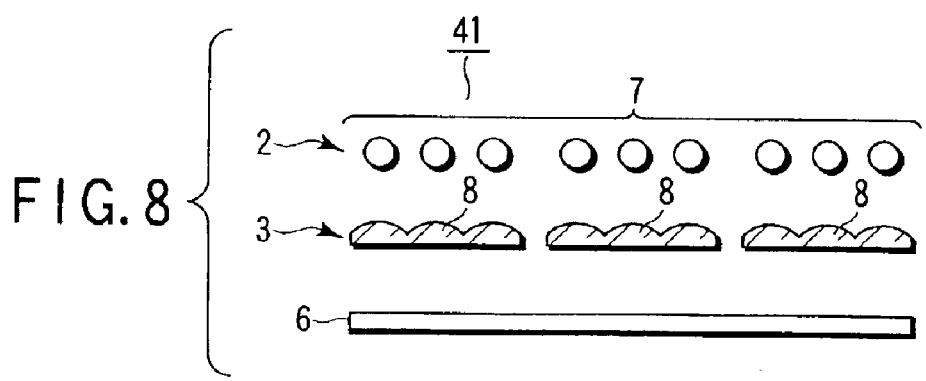
FIG. 8 is a sectional view illustrating the interior of a process chamber incorporated in another semiconductor device manufacturing apparatus according to the third embodiment.
Figure 9:
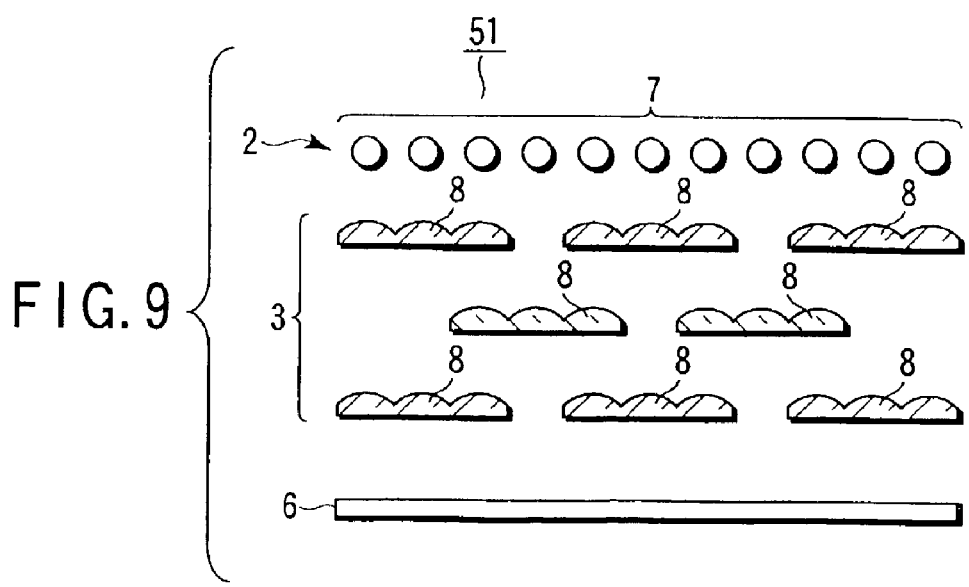
FIG. 9 is a sectional view illustrating the interior of a process chamber incorporated in yet another semiconductor device manufacturing apparatus according to the third embodiment.

Referring to FIGS. 7–9, a third embodiment of the invention will be described. FIGS. 7–9 are sectional views illustrating the interior of process chambers incorporated in respective semiconductor device manufacturing apparatuses according to the third embodiment. In these figures, elements similar to those employed in the first embodiment are denoted by corresponding reference numerals, and no detailed description is given thereof.

As shown in FIGS. 7–9, in semiconductor device manufacturing apparatuses 31, 41 and 51 according to the third embodiment, a plurality of light intensity adjusting members 3 are interposed between a to-be-processed substrate 6 and flash lamp light-source unit 2 (flash lamps 7). The semiconductor device manufacturing apparatuses 31, 41 and 51 are also lamp heating apparatuses.

Specifically, in the semiconductor device manufacturing apparatus 31 shown in FIG. 7, a plurality of light intensity adjusting members 3 are provided between the substrate 6 and flash lamp light-source unit 2. The light intensity adjusting members 3 are arranged along a nearly normal direction to the major surface of the substrate 6. And the light intensity adjusting members 3 are apart from each other.

In the semiconductor device manufacturing apparatus 41 shown in FIG. 8, a plurality of light intensity adjusting members 3 are provided between the substrate 6 and flash lamp light-source unit 2. The light intensity adjusting members 3 are arranged in line along a nearly parallel direction to the major surface of the substrate 6. And the light intensity adjusting members 3 are apart from each other.

In the semiconductor device manufacturing apparatus 51 shown in FIG. 9, a plurality of light intensity adjusting members 3 are provided between the substrate 6 and flash lamp light-source unit 2. The light intensity adjusting members 3 are arranged in lines along a nearly normal and a nearly parallel direction to the major surface of the substrate 6. And the light intensity adjusting members 3 are apart from each other.

As described above, the third embodiment can provide the same advantage as obtained by the first embodiment. Further, since a plurality of light intensity adjusting members 3 are provided between the substrate 6 and flash lamp light-source unit 2, the degree of uneven heating of the substrate 6 can be further reduced. As a result, a better quality impurity diffusion region can be formed, resulting in the manufacture of a semiconductor device of a higher performance, quality and reliability. This leads to enhancement of the yield and production efficiency of semiconductor devices.

(Fourth Embodiment)

Figure 10:
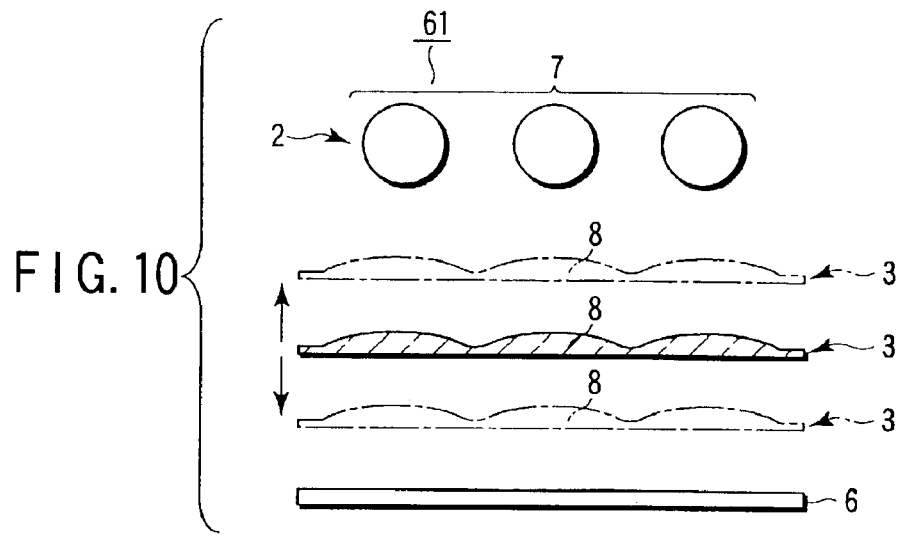
FIG. 10 is a sectional view illustrating the interior of a process chamber incorporated in a semiconductor device manufacturing apparatus according to a fourth embodiment.
Figure 11:
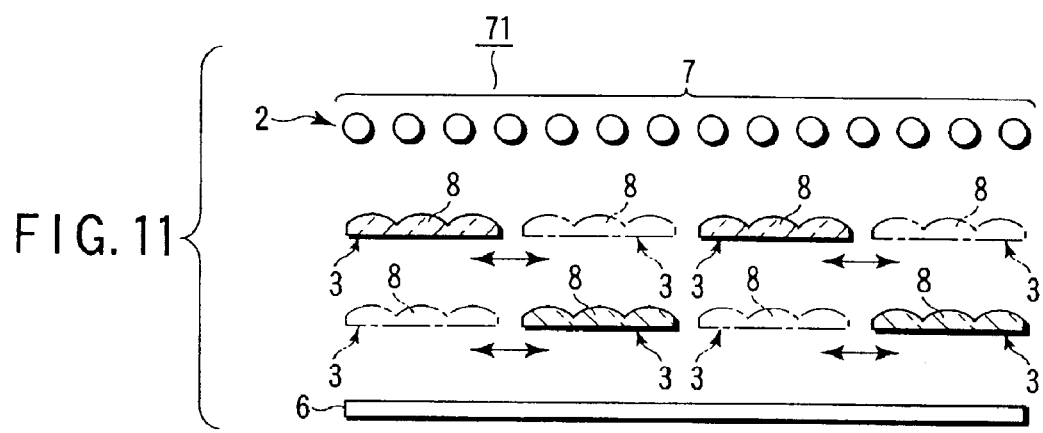
FIG. 11 is a sectional view illustrating the interior of a process chamber incorporated in another semiconductor device manufacturing apparatus according to the fourth embodiment.
Figure 12:
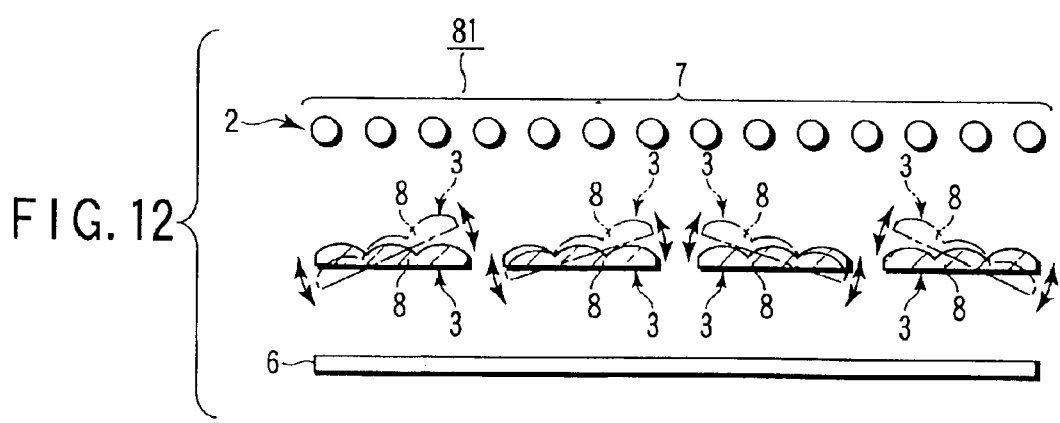
FIG. 12 is a sectional view illustrating the interior of a process chamber incorporated in yet another semiconductor device manufacturing apparatus according to the third embodiment.
Figure 13:
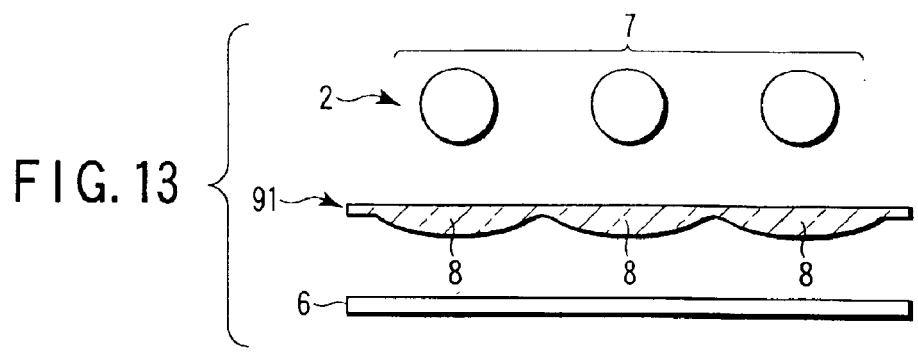
FIG. 13 is a sectional view illustrating the interior of a process chamber incorporated in a semiconductor device manufacturing apparatus according to a fifth embodiment.
Figure 14:
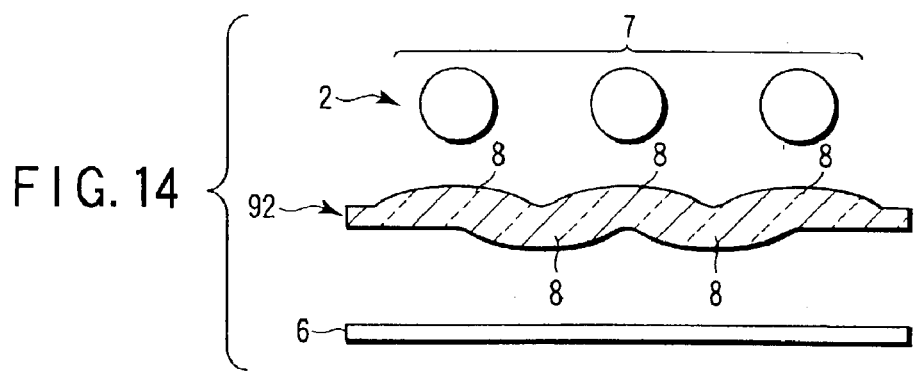
FIG. 14 is a sectional view illustrating the interior of a process chamber incorporated in another semiconductor device manufacturing apparatus according to the fifth embodiment.

Referring to FIGS. 10–12, a fourth embodiment of the invention will be described. FIGS. 10–12 are sectional views illustrating the interior of process chambers incorporated in respective semiconductor device manufacturing apparatuses according to the fourth embodiment. In these figures, elements similar to those employed in the first embodiment are denoted by corresponding reference numerals, and no detailed description is given thereof.

As shown in FIGS. 10–12, in semiconductor device manufacturing apparatuses 61, 71 and 81 according to the third embodiment, one or more light intensity adjusting members 3 are interposed between the to-be-processed substrate 6 and flash lamp light-source unit 2 (flash lamps 7). The light intensity adjusting members 3 are movable in the directions as specified below. The semiconductor device manufacturing apparatuses 61, 71 and 81 are also lamp heating apparatuses.

Specifically, in the semiconductor device manufacturing apparatus 61 shown in FIG. 10, one light intensity adjusting member 3 is provided between the substrate 6 and flash lamp light-source unit 2. And the light intensity adjusting member 3 is movable toward or away from each of the substrate 6 and light source unit 2.

In the semiconductor device manufacturing apparatus 71 shown in FIG. 11, a plurality of light intensity adjusting members 3 are provided between the substrate 6 and flash lamp light-source unit 2. The light intensity adjusting members 3 are arranged in lines along a nearly parallel direction to the major surface of the substrate 6. These lines are separate from each other in a direction perpendicular to the major surface of the substrate 6. The light intensity adjusting members 3 are apart from each other. And the light intensity adjusting members 3 are movable in directions nearly parallel to the major surface of the substrate 6.

In the semiconductor device manufacturing apparatus 81 shown in FIG. 12, a plurality of light intensity adjusting members 3 are provided between the substrate 6 and flash lamp light-source unit 2. The members 3 are arranged in line along a nearly parallel direction to the major surface of the substrate 6. The light intensity adjusting members 3 are apart from each other. The members 3 are angularly movable with respect to the major surface of the substrate 6. Accordingly, the angle of each member 3 with respect to the substrate 6 can be varied appropriately.

As described above, the fourth embodiment can provide the same advantage as obtained by the first embodiment. Further, since the position and/or angle of each light intensity adjusting member 3 can be appropriately adjusted, the degree of uneven heating of the substrate 6 can be further reduced than in the third embodiment. As a result, a better quality impurity diffusion region can be formed, resulting in the manufacture of a semiconductor device of a higher performance, quality and reliability. This leads to enhancement of the yield and production efficiency of semiconductor devices.

(Fifth Embodiment)

Referring to FIGS. 13–22, a fifth embodiment of the invention will be described. FIGS. 13–22 are sectional views illustrating the interior of process chambers incorporated in respective semiconductor device manufacturing apparatuses according to the fifth embodiment. In these figures, elements similar to those employed in the first embodiment are denoted by corresponding reference numerals, and no detailed description is given thereof.

As shown in FIGS. 13–22, the shape of each light intensity adjusting member 91–101 is not limited to that employed in the first embodiment. Specifically, the light intensity adjusting member 91 shown in FIG. 13 has convex lens portions 8 at the surface opposing the to-be-processed substrate 6. Further, the light intensity adjusting member 92 shown in FIG. 14 has convex lens portions 8 at the opposite surfaces. In the light intensity adjusting members 91 and 92, the convex lens 8 forms an incident angle adjusting portion.

Figure 15:
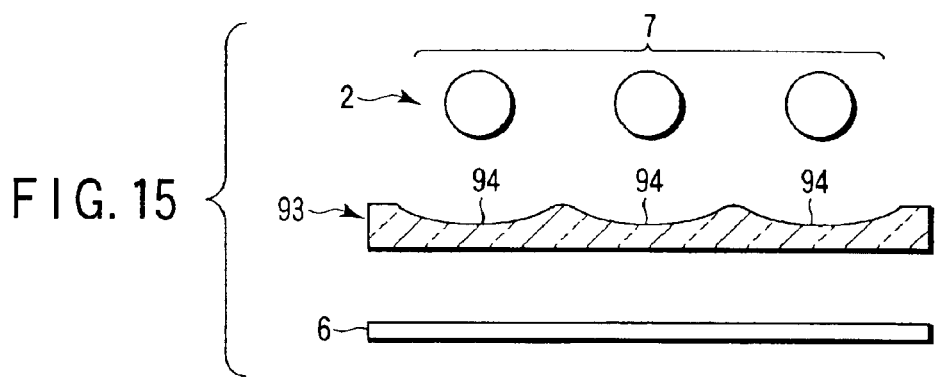
FIG. 15 is a sectional view illustrating the interior of a process chamber incorporated in another semiconductor device manufacturing apparatus according to the fifth embodiment.
Figure 16:
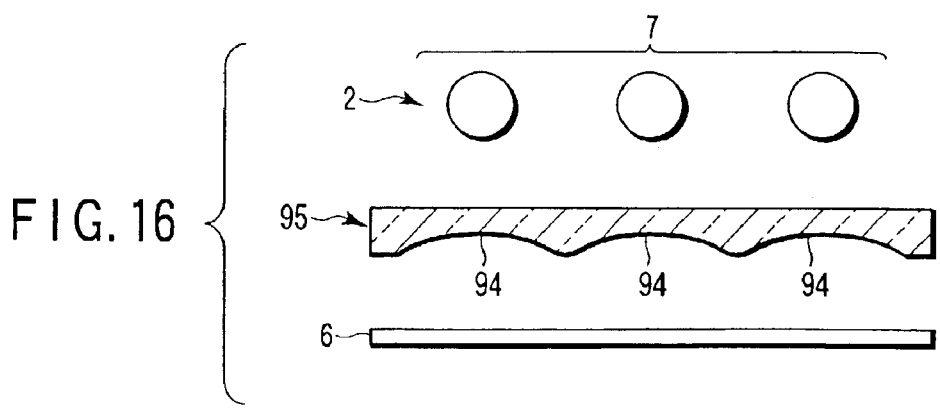
FIG. 16 is a sectional view illustrating the interior of a process chamber incorporated in another semiconductor device manufacturing apparatus according to the fifth embodiment.
Figure 17:
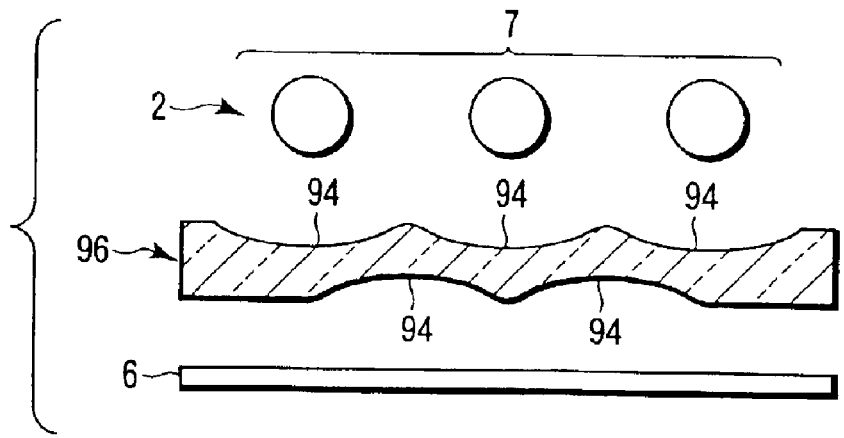
FIG. 17 is a sectional view illustrating the interior of a process chamber incorporated in another semiconductor device manufacturing apparatus according to the fifth embodiment.

On the other hand, the light intensity adjusting member 93 shown in FIG. 15 has a plurality of concave lens portions 94 provided in the form of dents at the surface opposing the flash lamp light-source unit 2 (flash lamps 7). Further, the light intensity adjusting member 95 shown in FIG. 16 has a plurality of concave lens portions 94 provided in the form of dents at the surface opposing the to-be-processed substrate 6. The light intensity adjusting member 96 shown in FIG. 17 has a plurality of concave lens portions 94 provided at the opposite surfaces opposing the flash lamp light-source unit 2 and substrate 6.

Figure 18:
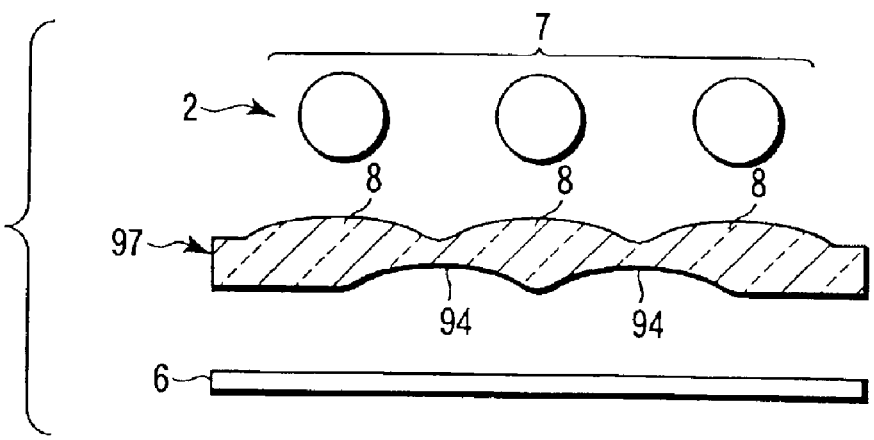
FIG. 18 is a sectional view illustrating the interior of a process chamber incorporated in another semiconductor device manufacturing apparatus according to the fifth embodiment.
Figure 19:
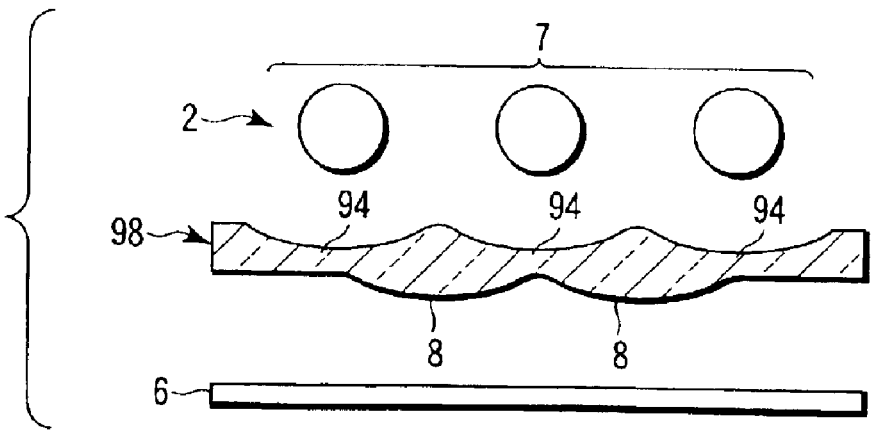
FIG. 19 is a sectional view illustrating the interior of a process chamber incorporated in another semiconductor device manufacturing apparatus according to the fifth embodiment.

Furthermore, the light intensity adjusting member 97 shown in FIG. 18 has a plurality of convex lens portions 8 provided at the surface opposing the flash lamp light-source unit 2, and also has a plurality of concave lens portions 94 provided at the surface opposing the substrate 6. The light intensity adjusting member 98 shown in FIG. 19 has a plurality of concave lens portions 94 provided at the surface opposing the flash lamp light-source unit 2, and also has a plurality of convex lens portions 8 provided at the surface opposing the substrate 6.

Figure 20:
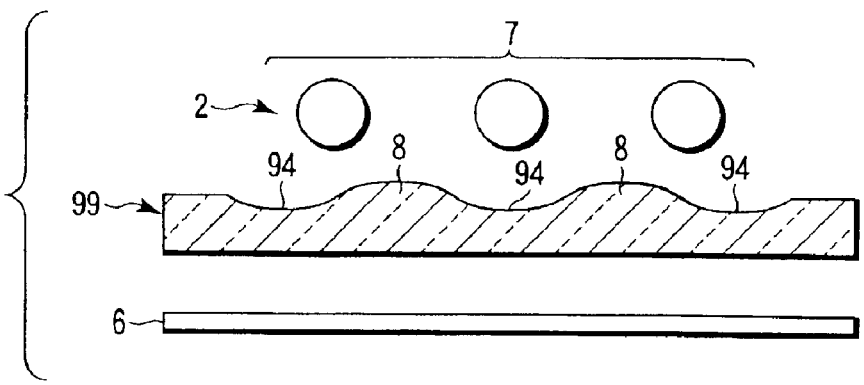
FIG. 20 is a sectional view illustrating the interior of a process chamber incorporated in another semiconductor device manufacturing apparatus according to the fifth embodiment.
Figure 21:
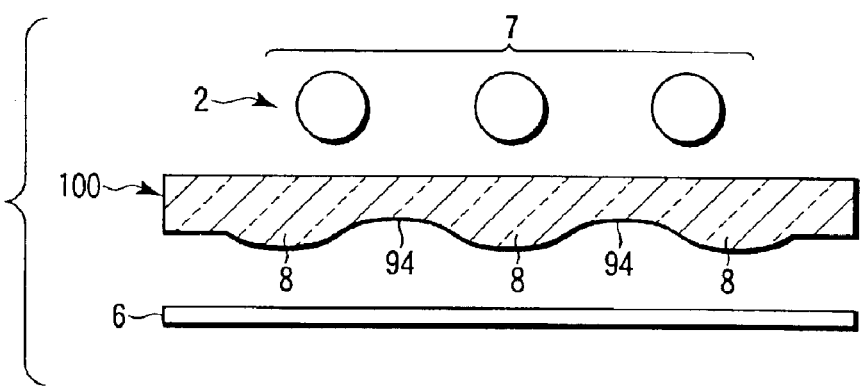
FIG. 21 is a sectional view illustrating the interior of a process chamber incorporated in another semiconductor device manufacturing apparatus according to the fifth embodiment.
Figure 22:
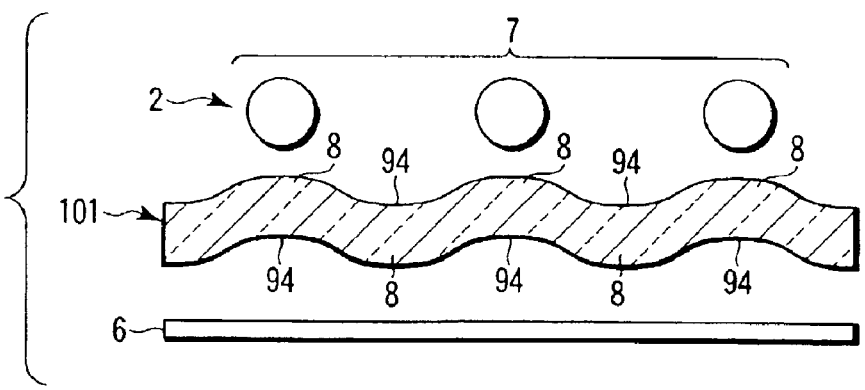
FIG. 22 is a sectional view illustrating the interior of a process chamber incorporated in yet another semiconductor device manufacturing apparatus according to the fifth embodiment.

In addition, the light intensity adjusting member 99 shown in FIG. 20 has a plurality of convex lens portions 8 and concave lens portions 94 provided alternately at the surface opposing the flash lamp light-source unit 2. The light intensity adjusting member 100 shown in FIG. 21 has a plurality of convex lens portions 8 and concave lens portions 94 provided alternately at the surface opposing the substrate 6. Further, the light intensity adjusting member 101 shown in FIG. 22 has a plurality of convex lens portions 8 and concave lens portions 94 provided alternately at each of the opposite surfaces opposing the flash lamp light-source unit 2 and substrate 6.

Each concave lens portion 94 has a curved surface. Further, the convex lens portions 8 and concave lens portions 94 have respective appropriate sizes and shapes, and are appropriately positioned and combined. These lens portions enable the light rays emitted from the light source unit 2 to be uniformly applied to the surface of the to-be-processed substrate 6.

As described above, the fifth embodiment can provide the same advantage as obtained by the first embodiment. Further, since appropriately combined convex and concave lens portions 8 and 94 can be provided at a single light intensity adjusting member, light rays can be uniformly applied to the surface of the substrate 6 without using a plurality of light intensity adjusting members. Accordingly, the semiconductor device manufacturing apparatus of the fifth embodiment can be made more compact, with the degree of uneven heating of the substrate 6 reduced. Therefore, the semiconductor device manufacturing apparatus of the fifth embodiment can provide the same advantage as obtained by the third or fourth embodiment, even if it has substantially the same size as the manufacturing apparatus 1 of the first embodiment. Further, it is sufficient if at least the convex lens portions 8 or concave lens portions 94 are provided at at least one of the surfaces of the light intensity adjusting member.

(Sixth Embodiment)

Referring to FIGS. 23–28, a sixth embodiment of the invention will be described. FIGS. 24–28 are sectional views illustrating light intensity adjusting members 111–117 each incorporated in a semiconductor device manufacturing apparatus according to the sixth embodiment.

In the light intensity adjusting members according to the sixth embodiment, their incident angle adjusting portion is not formed of the convex or concave lend portion 8 or 94, unlike the first to fifth embodiments. Specifically, the incident angle adjusting portion is formed of a material having a refractive index different from that of the other portion of each light intensity adjusting member. Therefore, the sixth embodiment, which does not employ the convex or concave lens portions, can substantially uniformly irradiate the surface of a to-be-processed substrate with light rays emitted from a light source unit and refracted by the light intensity adjusting member, as in the first to fifth embodiments.

Figure 23:
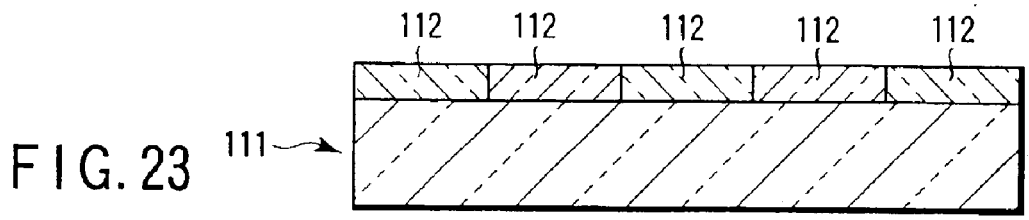
FIG. 23 is a sectional view illustrating a light intensity adjusting member incorporated in a semiconductor device manufacturing apparatus according to a sixth embodiment.
Figure 24:
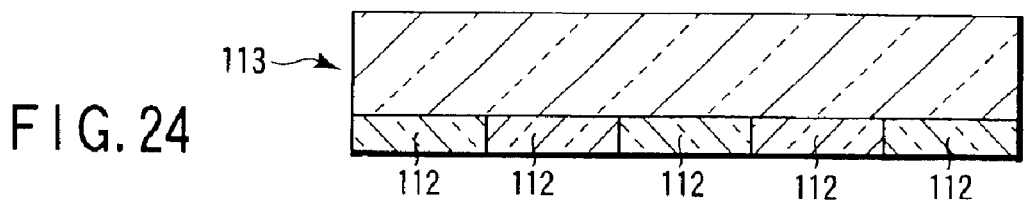
FIG. 24 is a sectional view illustrating a light intensity adjusting member incorporated in another semiconductor device manufacturing apparatus according to the sixth embodiment.
Figure 25:
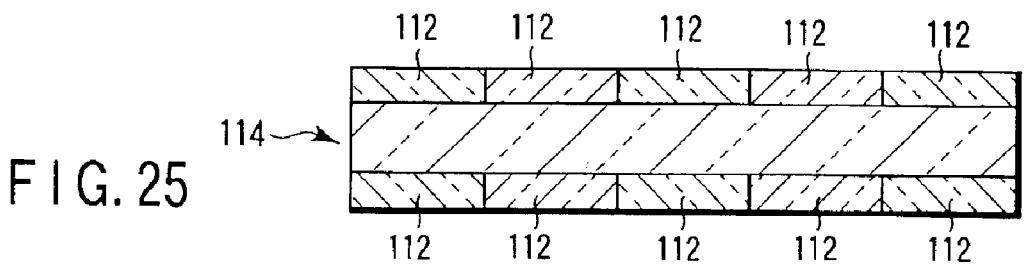
FIG. 25 is a sectional view illustrating a light intensity adjusting member incorporated in another semiconductor device manufacturing apparatus according to the sixth embodiment.

For example, the optical intensity adjusting member 111 shown in FIG. 23 has, at the surface opposing a light source unit (not shown), a plurality of incident angle adjusting portions 112 each made of a material having a predetermined refractive index. Some of the incident angle adjusting portions 112 may have the same refractive index. It is sufficient if each incident angle adjusting portions 112 has a refractive index different from that of the other portion of the light intensity adjusting member 111, and enables the light rays passing therethrough to be refracted and substantially uniformly applied to the surface of a to-be-processed substrate. Further, the optical intensity adjusting member 113 shown in FIG. 24 has a plurality of incident angle adjusting portions 112 at the surface opposing a to-be-processed substrate (not shown). The optical intensity adjusting member 114 shown in FIG. 25 has a plurality of incident angle adjusting portions 112 at the opposite surfaces.

Figure 26:
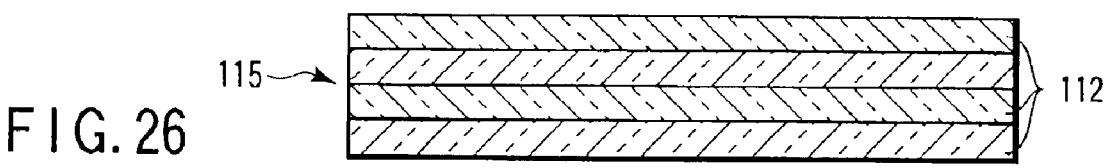
FIG. 26 is a sectional view illustrating a light intensity adjusting member incorporated in another semiconductor device manufacturing apparatus according to the sixth embodiment.
Figure 27:
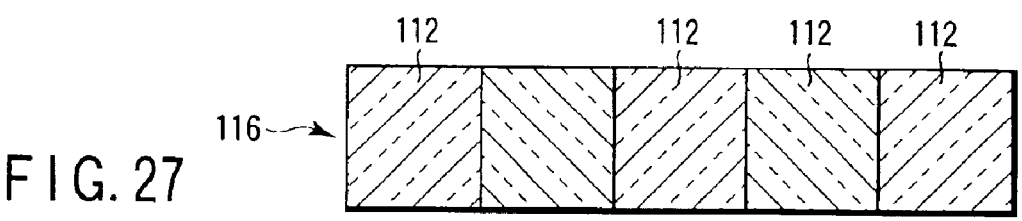
FIG. 27 is a sectional view illustrating a light intensity adjusting member incorporated in another semiconductor device manufacturing apparatus according to the sixth embodiment.

Furthermore, the optical intensity adjusting member 115 shown in FIG. 26 has an incident angle adjusting portion 112 in the form of a layer, or a plurality of incident angle adjusting portions 112 in the form of layers stacked in the thickness direction of the member 115, the incident angle adjusting portion(s) 112 covering each of the substantially entire upper and lower surfaces of the member 115. The optical intensity adjusting member 116 shown in FIG. 27 has one or more incident angle adjusting portions 112 arranged in the width direction of the member 116, the incident angle adjusting portion(s) 112 covering each of the substantially entire width-directional end surfaces of the member 116.

Figure 28:
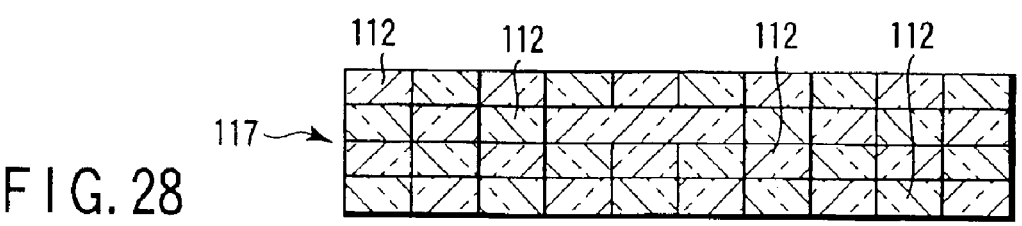
FIG. 28 is a sectional view illustrating a light intensity adjusting member incorporated in yet another semiconductor device manufacturing apparatus according to the sixth embodiment.

The optical intensity adjusting member 117 shown in FIG. 28 has one or more incident angle adjusting portions 112 arranged in the thickness direction of the member 117 and covering the substantially entire upper and lower surfaces of the member 117, and also has one or more incident angle adjusting portions 112 arranged in the width direction of the member 117 and covering the substantially entire width-directional end surfaces of the member 117. In other words, the light intensity adjusting member 117 has incident angle adjusting portions 112 corresponding to a combination of incident angle adjusting portions 112 incorporated in the light intensity adjusting members 115 and 116.

Each incident angle adjusting portion 112 has an appropriate size, shape, refractive index and position so that it enables the light rays emitted from the light source unit 2 to be uniformly applied to the surface of the to-be-processed substrate 6.

As described above, the sixth embodiment can provide the same advantage as obtained by the first to fifth embodiments.

(Seventh Embodiment)

Figure 29:
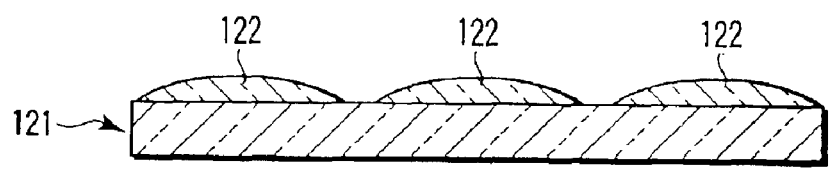
FIG. 29 is a sectional view illustrating a light intensity adjusting member incorporated in a semiconductor device manufacturing apparatus according to a seventh embodiment.
Figure 30:
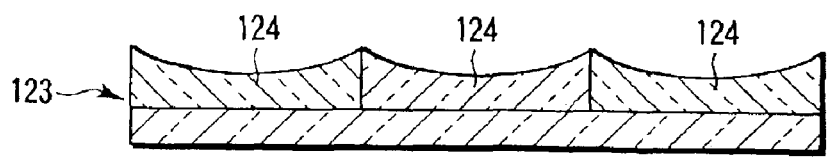
FIG. 30 is a sectional view illustrating a light intensity adjusting member incorporated in another semiconductor device manufacturing apparatus according to the seventh embodiment.

Referring to FIGS. 29 and 30, a seventh embodiment of the invention will be described. FIGS. 29 and 30 are sectional views illustrating light intensity adjusting members 121 and 123 each incorporated in a semiconductor device manufacturing apparatus according to the seventh embodiment.

Each light intensity adjusting member according to the seventh embodiment has light intensity adjusting members corresponding to a combination of light intensity adjusting members incorporated in the fifth and sixth embodiments. The incident angle adjusting portions of this embodiment comprise at least convex lens portions or concave lens portions, and are formed of a material that has a refractive index different from that of the other portion of the light intensity adjusting member.

Specifically, the optical intensity adjusting member 121 shown in FIG. 29 has, at one surface, a plurality of convex lens portions 122 as incident angle adjusting portions, which have respective refractive indexes. Some of the convex lens portions 122 may have the same refractive index. It is sufficient if each convex lens portion 122 has a refractive index different from that of the other portion of the light intensity adjusting member 121, and enables the light rays passing therethrough to be refracted and substantially uniformly applied to the surface of a to-be-processed substrate (not shown).

The optical intensity adjusting member 123 shown in FIG. 30 has, at one surface, a plurality of concave lens portions 124 as incident angle adjusting portions, which have respective refractive indexes. Some of the concave lens portions 124 may have the same refractive index. It is sufficient if each concave lens portion 124 has a refractive index different from that of the other portion of the light intensity adjusting member 123, and enables the light rays passing therethrough to be refracted and substantially uniformly applied to the surface of a to-be-processed substrate (not shown).

As described above, the seventh embodiment can provide the same advantage as obtained by the first, fifth or sixth embodiment. Further, light rays can be further uniformly applied to the surface of the substrate 6 by appropriately adjusting the curvature and refractive index of each convex or concave lens portion 122 or 124. As a result, the semiconductor device manufacturing apparatus of the seventh embodiment can be made more compact, with the degree of uneven heating of the substrate reduced. Therefore, the semiconductor device manufacturing apparatus of the seventh embodiment can provide the same advantage as obtained by the third or fourth embodiment, even if it has substantially the same size as the manufacturing apparatus 1 of the first embodiment.

(Eighth Embodiment)

Figure 31:
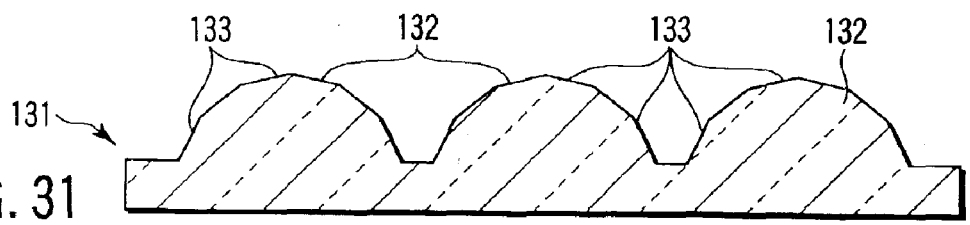
FIG. 31 is a sectional view illustrating a light intensity adjusting member incorporated in a semiconductor device manufacturing apparatus according to an eighth embodiment.
Figure 32:
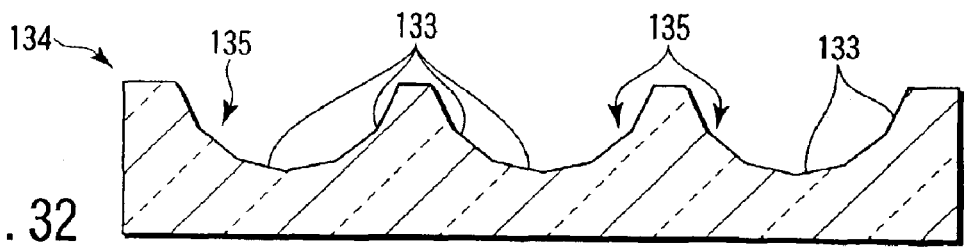
FIG. 32 is a sectional view illustrating a light intensity adjusting member incorporated in another semiconductor device manufacturing apparatus according to the eighth embodiment.
Figure 33:
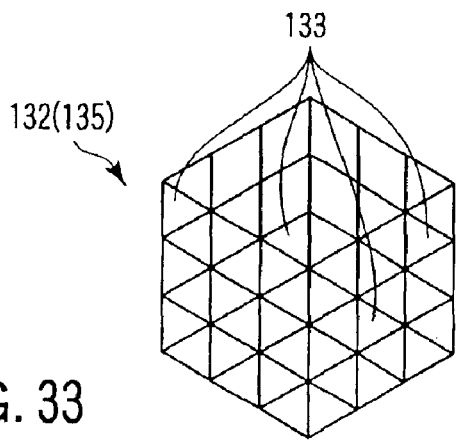
FIG. 33 is a plan view illustrating the surface of an incident angle adjusting portion incorporated in the light intensity adjusting member shown in FIGS. 31 and 32.

Referring to FIGS. 31–33, an eighth embodiment of the invention will be described. FIGS. 31 and 32 are sectional views illustrating light intensity adjusting members 131 and 134 each incorporated in a semiconductor device manufacturing apparatus according to the eighth embodiment. FIG. 33 is a plan view illustrating the surface of each incident angle adjusting portion incorporated in the light intensity adjusting members shown in FIGS. 31 and 32.

Each light intensity adjusting member according to the eighth embodiment has incident angle adjusting portions formed of at least convex lens portion or concave lens portions. Each convex or concave lens portion has a surface formed of a number of polygonal faces.

Specifically, the optical intensity adjusting member 131 shown in FIG. 31 has, at one surface, a plurality of convex lens portions 132 as incident angle adjusting portions. Each convex lens portion 132 has a surface formed of triangular faces 133 as shown in FIG. 33. Further, the optical intensity adjusting member 134 shown in FIG. 32 has, at one surface, a plurality of concave lens portions 135 as incident angle adjusting portions. Each concave lens portion also has a surface formed of triangular faces 133 as shown in FIG. 33.

By reducing the area of each face 133, each convex or concave lens portion 132 or 135 can have an optical performance substantially equivalent to that of the convex or concave lens portion 8 or 94 which has a curved surface.

As described above, the eighth embodiment can provide the same advantage as obtained by the first embodiment.

The semiconductor device manufacturing apparatus, method and semiconductor device of the invention are not limited to the above-described first to eighth embodiments. The invention can be modified in various ways without departing from the scope. For example, the structures and/or processes can be modified or combined appropriately.

More specifically, the use of the semiconductor manufacturing apparatuses and methods of the invention is not limited to the aforementioned heating processes RTA and RTP. It is a matter of course that they can also be applied to, for example, a heating process called "spike annealing" that requires a shorter heating time than RTA or RTP. They are also applicable to other various heating processes that require a longer heating time. In any case, where each semiconductor manufacturing apparatus and method of the invention are used, the degree of uneven heating of the to-be-processed substrate 6 is reduced.

Further, each semiconductor manufacturing apparatus of the invention is not limited to the above-described lamp heating apparatus. Of course, the apparatus can be also applied to a heating apparatus that comprises a lamp heating apparatus and furnace, and to a heating apparatus for simultaneously processing a plurality of substrates. The same can be said of the semiconductor device manufacturing method of the invention.

Furthermore, it is not a necessary condition to align one lamp with one incident angle adjusting portion of the light intensity adjusting member. The intervals between the lamps, light intensity adjusting member and to-be-processed substrate are variable. The size, shape and refractive index of the incident angle adjusting portion can be designed appropriately. If the surface of the incident angle adjusting portion is curved, its curvature can be set to any appropriate value.

If the surface of the incident angle adjusting portion is curved, the curved surface may have a single curvature and be spherical, or may have different curvatures at different portions and be aspherical. Further, one light intensity adjusting member may include both incident angle adjusting portions of a spherical surface and an aspherical surface. Similarly, one light intensity adjusting member may have a substantially single refractive index or may have different refractive indexes at different portions. It is sufficient if those conditions are determined so that light rays can be uniformly applied to the surface of the to-be-processed substrate.

Moreover, the size, shape, refractive index, curvature, etc. of each incident angle adjusting portion, and the number of indicant angle adjusting portions are set so that the light rays having passed through the incident angle adjusting portion will have a desired intensity. For example, the incident angle adjusting portion may have an enhanced light converging function compared to the light diverging function. In this structure, the intensity of the light rays applied to the surface of the to-be-processed substrate may be set, over the entire surface of the substrate, to substantially the same value as the maximum intensity of the light rays that have not yet passed through the incident angle adjusting portion. Similarly, by enhancing the light converging function of the incident angle adjusting portion, the intensity of the light rays applied to the surface of the to-be-processed substrate may be set, over the entire surface of the substrate, to a value higher than the maximum intensity of the light rays that have not yet passed through the incident angle adjusting portion.

Alternatively, the incident angle adjusting portion may have an enhanced light diverging function compared to the light converging function. In this structure, the intensity of the light rays applied to the surface of the to-be-processed substrate may be set, over the entire surface of the substrate, to substantially the same value as the minimum intensity of the light rays that have not yet passed through the incident angle adjusting portion. Similarly, by enhancing the light diverging function of the incident angle adjusting portion, the intensity of the light rays applied to the surface of the to-be-processed substrate may be set, over the entire surface of the substrate, to a value lower than the minimum intensity of the light rays that have not yet passed through the incident angle adjusting portion.

As described above, by changing the optical function of the incident angle adjusting portion, light rays of an appropriate intensity can be substantially uniformly applied to the surface of the to-be-processed substrate to realize a desired heating state. Further, it is, of course, preferable that the incident angle adjusting portion should be improved in various optical aberrations.

The heat/light source 2 is not limited to a flash lamp formed of a xenon lamp. A halogen lamp having, for example, a tungsten filament may be used as the heat/light source 2.

In the semiconductor device manufacturing apparatuses 61, 71 and 81 of the fourth embodiment, the respective directions of movement of the light intensity adjusting member 3 may be combined. Further, if a plurality of light intensity adjusting members 3 are used, it is not always necessary to make all the members 3 movable. Only one of the members 3 may be made movable. The number of movable light intensity adjusting members can be set to an appropriate value.

The light intensity adjusting members 91, 92, 93, 95, 96, 97, 98, 99, 100 and 101 of the fifth embodiment may each be employed in each of the semiconductor device manufacturing apparatuses 31, 41, 51, 61, 71 and 81 of the third and fourth embodiments. Each of the light intensity adjusting members 111, 113, 114, 115, 116 and 117 of the sixth embodiment may be formed of a plurality of incident angle adjusting portions of respective refractive indexes. Further, in the light intensity adjusting members 121 and 123 of the seventh embodiment, one or more of the convex and concave lens portions 122 (or 124) may be formed integral with the member 121 (or 123) as one body, respectively.

In addition, in the light intensity adjusting members 131 and 134 of the eighth embodiment, each face of the surface of each of the convex and concave lens portions 132 and 135 is not limited to a triangular one, but may be square, pentangular, or hexagonal one. Furthermore, some of the light intensity adjusting members 91, 92, 93, 95, 96, 97, 98, 99, 100, 101, 111, 113, 114, 115, 116, 117, 121, 123, 131 and 134 of the fifth to eighth embodiments may be appropriately combined and used in each of the semiconductor device manufacturing apparatuses 31, 41, 51, 61, 71 and 81 of the third and fourth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus of manufacturing a semiconductor device, comprising:
    at least one heat/light source opposing at least one major surface of a to-be-processed substrate, the heat/light source emitting light rays with a heating function onto the major surface of the to-be-processed substrate; and
    at least one light intensity adjusting member interposed between the heat/light source and the to-be-processed substrate, the light intensity adjusting member being made of a material which can pass therethrough the light rays, the light intensity adjusting member adjusting, to a substantially predetermined value, an intensity of the light rays at the major surface of the to-be-processed substrate.

2. The apparatus according to claim 1, wherein:
    said at least one heat/light source opposing each of opposite the major surfaces of the to-be-processed substrate, and said at least one light intensity adjusting member interposed between one of the heat/light source and each of opposite the major surfaces of the to-be-processed substrate.

3. The apparatus according to claim 1, wherein the heat/light source is one of a flash lamp and a halogen lamp having a filament.

4. The apparatus according to claim 1, wherein the light intensity adjusting member is made of a material which has a high transmittance and permits the light rays to pass therethrough with little energy loss.

5. The apparatus according to claim 4, wherein the light intensity adjusting member is made of quartz.

6. The apparatus according to claim 1, wherein the light intensity adjusting member includes at least one incident angle adjusting portion, the incident angle adjusting portion refracting the light rays to adjust, to a substantially predetermined value, an incident angle of the light rays with respect to the major surface of the to-be-processed substrate.

7. The apparatus according to claim 6, wherein the incident angle adjusting portion adjusts the incident angle to $0°±3°$.

8. The apparatus according to claim 6, wherein the incident angle adjusting portion is a convex lens portion, the convex lens portion projecting from at least one of a major surface of the light intensity adjusting member opposing the heat/light source, and a major surface of the light intensity adjusting member opposing the to-be-processed substrate.

9. The apparatus according to claim 6, wherein the incident angle adjusting portion is a concave lens portion, the concave lens portion being provided in the form of a dent at least one of a major surface of the light intensity adjusting member opposing the heat/light source, and a major surface of the light intensity adjusting member opposing the to-be-processed substrate.

10. The apparatus according to claim 6, wherein the incident angle adjusting portion is formed of at least one convex lens portion and at least one concave lens portion, the convex lens portion projecting from at least one of a major surface of the light intensity adjusting member opposing the heat/light source, and a major surface of the light intensity adjusting member opposing the to-be-processed substrate, the concave lens portion being provided in the form of a dent at least one of the major surface of the light intensity adjusting member opposing the heat/light source, and the major surface of the light intensity adjusting member opposing the to-be-processed substrate.

11. The apparatus according to claim 6, wherein the incident angle adjusting portion has a curved surface.

12. The apparatus according to claim 6, wherein the incident angle adjusting portion has a surface formed of a plurality of polygonal faces.

13. The apparatus according to claim 6, wherein the incident angle adjusting portion is made of a material having a refractive index different from a refractive index of another portion of the light intensity adjusting member.

14. The apparatus according to claim 6, wherein the incident angle adjusting portion adjusts, to a substantially predetermined value, an energy density of the light rays at the major surface of the to-be-processed substrate.

15. The apparatus according to claim 1, which comprises a plurality of the light intensity adjusting members interposed between the heat/light source and said at least one major surface of the to-be-processed substrate.

16. The apparatus according to claim 15, wherein the light intensity adjusting members being arranged along a nearly normal direction to said at least one major surface of the to-be-processed substrate, and being apart from each other.

17. The apparatus according to claim 15, wherein the light intensity adjusting members being arranged along a nearly parallel direction to said at least one major surface of the to-be-processed substrate, and being apart from each other.

18. The apparatus according to claim 15, wherein the light intensity adjusting members being arranged along a nearly normal or a nearly parallel direction to said at least one major surface of the to-be-processed substrate, and being apart from each other.

19. The apparatus according to claim 1, wherein the light intensity adjusting member is movable.

20. The apparatus according to claim 19, wherein the light intensity adjusting member is movable toward or away from the to-be-processed substrate.

21. The apparatus according to claim 19, wherein the light intensity adjusting member is movable in a direction nearly parallel to the major surface of the to-be-processed substrate.

22. The apparatus according to claim 19, wherein an angle of the light intensity adjusting member can be changed with respect to the major surface of the to-be-processed substrate.

23. A method of manufacturing a semiconductor device, comprising:

interposing at least one light intensity adjusting member between a to-be-processed substrate and a heat/light source opposing at least one major surface of the to-be-processed substrate, and emitting light rays from the heat/light source onto said at least one major surface of the to-be-processed substrate; and adjusting, to a substantially predetermined value, an intensity of the light rays at the major surface of the to-be-processed substrate, using the light intensity adjusting member, the light intensity adjusting member being formed of a material which can pass therethrough the light rays.

24. The method according to claim 23, wherein the light rays are emitted onto an impurity diffusion region formed in a surface portion of the to-be-processed substrate.

25. A semiconductor device comprising:

a semiconductor substrate on which a heating process is executed by a semiconductor device manufacturing apparatus, the semiconductor device manufacturing apparatus including:

at least one heat/light source opposing at least one major surface of a to-be-processed substrate, the heat/light source emitting light rays with a heating function onto the major surface of the to-be-processed substrate; and at least light intensity adjusting member interposed between the heat/light source and the to-be-processed substrate, the light intensity adjusting member being made of a material which can pass therethrough the light rays, the light intensity adjusting member adjusting, to a substantially predetermined value, an intensity of the light rays at the major surface of the to-be-processed substrate.

26. The semiconductor device according to claim 25, further comprising a MOS transistor having an impurity diffusion region formed in a surface portion of the semiconductor substrate and subjected to the heating process.

27. A semiconductor device comprising:

a semiconductor substrate on which a heating process is executed by a semiconductor device manufacturing method, the semiconductor device manufacturing method including:

interposing at least one light intensity adjusting member between a to-be-processed substrate and a heat/light source opposing at least one major surface of the to-be-processed substrate, and emitting light rays from the heat/light source onto said at least one major surface of the to-be-processed substrate; and adjusting, to a substantially predetermined value, an intensity of the light rays at the major surface of the to-be-processed substrate, using the light intensity adjusting member, the light intensity adjusting member being formed of a material which can pass therethrough the light rays.

28. The semiconductor device according to claim 27, further comprising a MOS transistor having an impurity diffusion region formed in a surface portion of the semiconductor substrate and subjected to the heating process.

* * * * *